United States Patent
Ma et al.

(10) Patent No.: US 11,813,829 B2
(45) Date of Patent: *Nov. 14, 2023

(54) CUT PROCESSING OF LAYERED COMPOSITES BY WATER VAPOR ANNEALING

(71) Applicant: Georgia Tech Research Corporation, Atlanta, GA (US)

(72) Inventors: Ruilong Ma, Atlanta, GA (US); Vladimirv V. Tsukruk, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 914 days.

This patent is subject to a terminal disclaimer.

(21) Appl. No.: 16/507,479

(22) Filed: Jul. 10, 2019

(65) Prior Publication Data

US 2020/0016878 A1    Jan. 16, 2020

Related U.S. Application Data

(60) Provisional application No. 62/695,933, filed on Jul. 10, 2018.

(51) Int. Cl.
  *B32B 9/00* (2006.01)
  *B32B 29/06* (2006.01)
  *H02N 1/04* (2006.01)
  *B32B 29/02* (2006.01)
  *B82Y 30/00* (2011.01)

(52) U.S. Cl.
  CPC .............. *B32B 29/06* (2013.01); *B32B 29/02* (2013.01); *H02N 1/04* (2013.01); *B32B 2264/102* (2013.01); *B32B 2457/00* (2013.01); *B82Y 30/00* (2013.01); *Y10T 428/30* (2015.01)

(58) Field of Classification Search
  CPC ........ Y10T 428/30; B32B 9/007; B82Y 30/00
  USPC .............................................. 428/408; 423/448
  See application file for complete search history.

(56) References Cited

U.S. PATENT DOCUMENTS

| 2013/0156678 A1* | 6/2013 | Banerjee | H01G 11/36 |
| | | | 204/507 |
| 2014/0124822 A1* | 5/2014 | Yan | H01L 33/641 |
| | | | 257/99 |
| 2016/0299270 A1* | 10/2016 | Kotov | G02B 5/1861 |
| 2017/0338312 A1* | 11/2017 | Treossi | B32B 9/007 |
| 2018/0028715 A1* | 2/2018 | Eisenfrats | A61L 24/0078 |

FOREIGN PATENT DOCUMENTS

DE    10 2012 024329 A1 * 12/2014

* cited by examiner

*Primary Examiner* — Daniel H Miller
(74) *Attorney, Agent, or Firm* — Bryan W. Bockhop; Bockhop Intellectual Property Law, LLC

(57) ABSTRACT

In a method for making a flexible material, a sheet of graphene oxide-composite paper is subjected to an environment having a relative humidity above a predetermined threshold for a predetermined amount of time. At least one expansion cut is cut in the sheet of graphene oxide-composite paper. A flexible conductive material includes a sheet of graphene oxide-composite paper defining at least one cut passing therethrough and formed it a kirigami structure. A region of the sheet of graphene oxide-composite paper includes reduced graphene oxide.

20 Claims, 3 Drawing Sheets

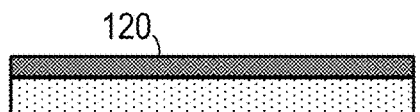
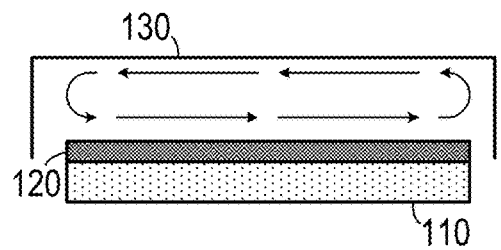
FIG. 1A            FIG. 1B
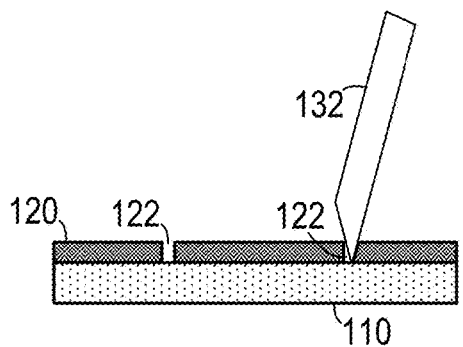
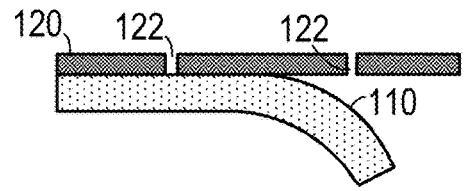
FIG. 1C            FIG. 1D
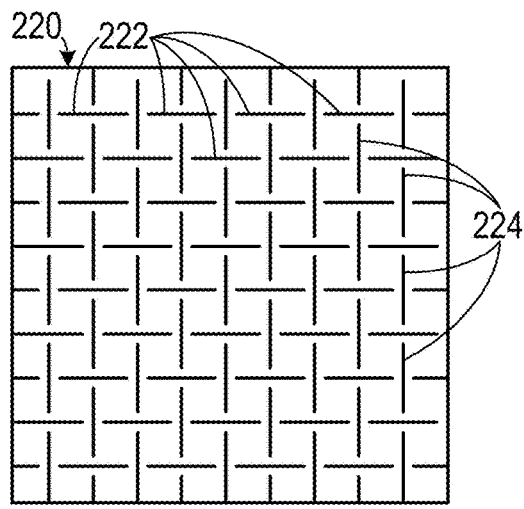
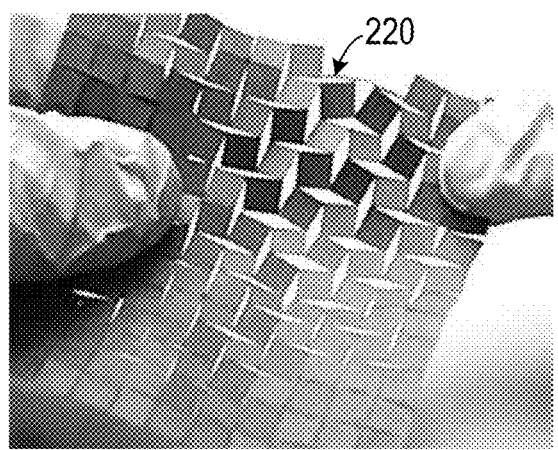
FIG. 2A            FIG. 2B

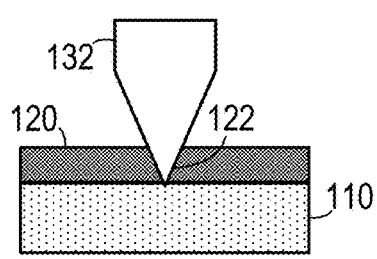 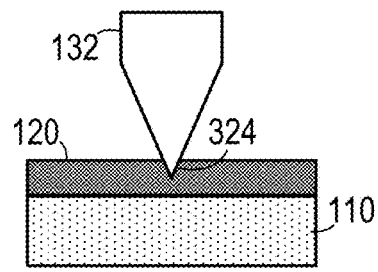
FIG. 3A  FIG. 3B
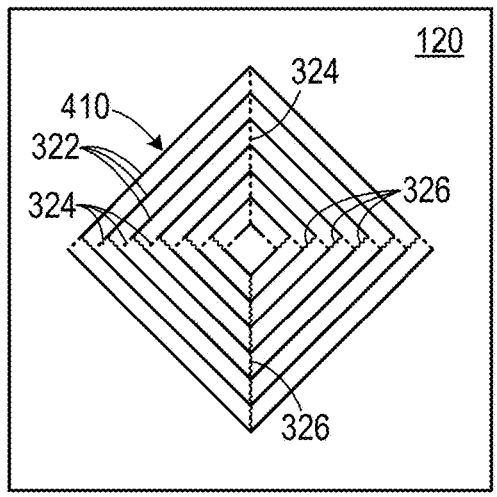 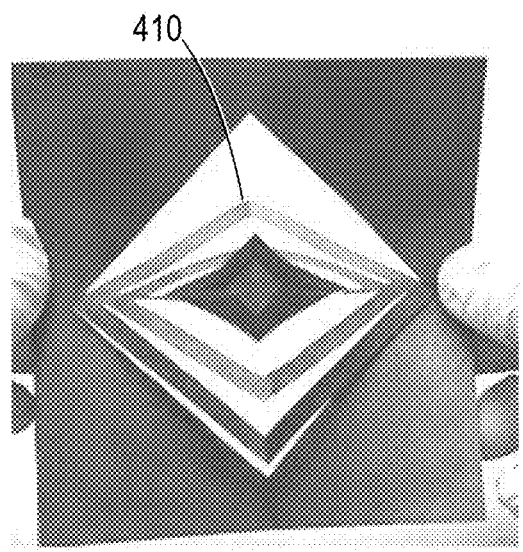
FIG. 4A  FIG. 4B
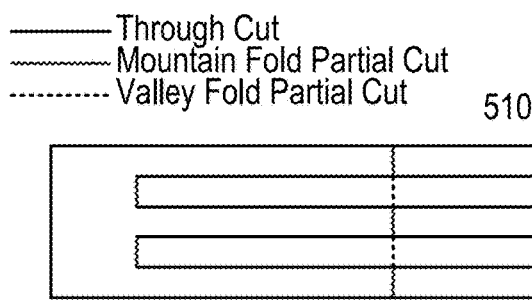 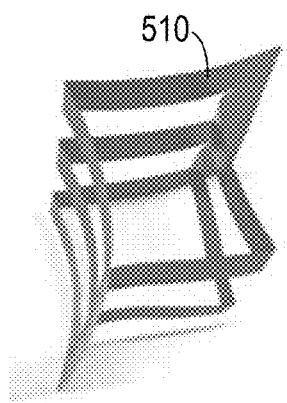
FIG. 5A  FIG. 5B

CUT PROCESSING OF LAYERED COMPOSITES BY WATER VAPOR ANNEALING

CROSS-REFERENCE TO RELATED APPLICATION(S)

This application claims the benefit of U.S. Provisional Patent Application Ser. No. 62/695,933, filed Jul. 10, 2018, the entirety of which is hereby incorporated herein by reference.

STATEMENT OF GOVERNMENT SUPPORT

This invention was made with government support under grant number FA9550-17-1-0297, awarded by the Department of Defense; and grant number FA9550-14-1-0269, awarded by the Department of Defense; and grant number 1538215, awarded by the National Science Foundation. The government has certain rights in the invention.

BACKGROUND OF THE INVENTION

1. Field of the Invention

The present invention relates to flexible structures and, more specifically, to a method of making flexible conductive structures.

2. Description of the Related Art

Typical electronic devices tend to employ conventional semiconductor components linked by noble metal interconnects through multi-stage print and lithographic processes. However, these devices have an environmentally-harmful lifecycle, often involving toxic chemicals or high embedded energy in material extraction, material processing and waste by-product treatment. Accumulation of such bulky electronic waste in landfills bears significant threat to environmental and human health. Additionally, most conventional electronic materials have a fixed form-factor and inability to adapt their shape or performance in response to the external stimuli. Devices fabricated from these materials tend to be bulky and often cannot accommodate strains without material failure.

The have been suggestions to fabricate electronic devices on flexible substrates, including certain types of composite paper. Such papers typically include a semiconducting material, such as graphene oxide flakes, that are held in place by fibers, such as silk fibers. However, such papers tend to have brittle surfaces that result in undesirable surface features when cut. Such surface features can interfere with the operation of electronic circuits.

Therefore, there is a need for a method of manipulating composite papers to avoid the formation of undesirable surface features as a result of cutting.

SUMMARY OF THE INVENTION

The disadvantages of the prior art are overcome by the present invention which, in one aspect, is a method for making a flexible material, in which a sheet of graphene oxide-composite paper is subjected to an environment having a relative humidity above a predetermined threshold for a predetermined amount of time. At least one expansion cut is cut in the sheet of graphene oxide-composite paper.

In another aspect, the invention is a method for making a flexible conductive material, in which a sheet of a composite paper including graphene oxide particles and silk fibers is subjected to an environment having a relative humidity above a predetermined threshold for a predetermined amount of time. Aluminum is applied to a region of the sheet of composite paper so as to increase electrical conductivity of the region of the sheet of composite paper. The aluminum is removed from the region of the sheet of composite paper so as to expose a region of reduced graphene oxide. At least one expansion cut is cut in the sheet of composite paper. The sheet of composite paper is manipulated into a kirigami structure.

In yet another aspect, the invention is a flexible conductive material that includes a sheet of graphene oxide-composite paper defining at least one cut passing therethrough and formed it a kirigami structure. A region of the sheet of graphene oxide-composite paper includes reduced graphene oxide.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIGS. 1A-1D are a series of schematic diagrams demonstrating one method for cutting a graphene oxide composite paper.

FIG. 2A is a schematic diagram showing a plan for cutting a paper sheet that is stretchable in two dimensions.

FIG. 2B is a photograph of a paper sheet cut according to the plan shown in FIG. 2A.

FIG. 3A is a schematic diagram showing a through cut of a paper sheet.

FIG. 3B is a schematic diagram showing a partial cut of a paper sheet.

FIG. 4A is a schematic diagram showing a plan for cutting a paper sheet used in making a diamond-shape kirigami structure.

FIG. 4B is a photograph of a kirigami structure made from a paper sheet cut according to the plan shown in FIG. 4A.

FIG. 5A is a schematic diagram showing a plan for cutting a paper sheet used in making a compressible kirigami structure.

FIG. 5B is a photograph of a kirigami structure made from a paper sheet cut according to the plan shown in FIG. 5A.

DETAILED DESCRIPTION OF THE INVENTION

Figure 6A:
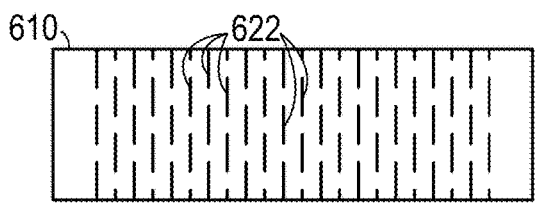
FIG. 6A is a schematic diagram showing a plan for cutting a paper sheet that is stretchable along one dimension.
Figure 6B:
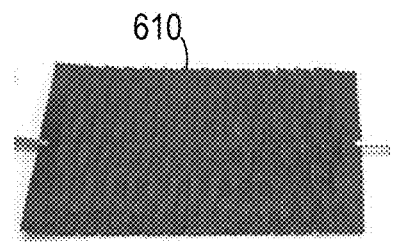
FIGS. 6B-6E is a series of photographs showing a paper sheet cut according to the plan of FIG. 6A as it is stretched.
Figure 6C:
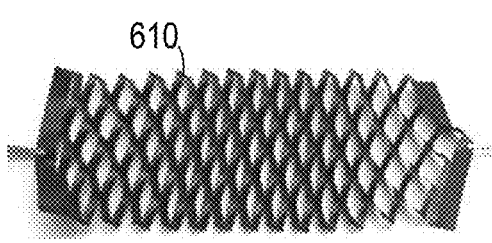
Figure 6D:
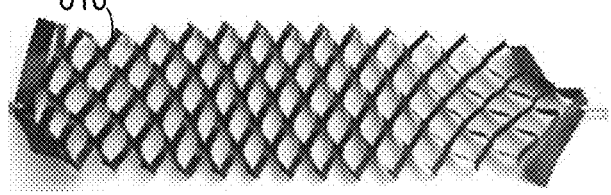
Figure 6E:
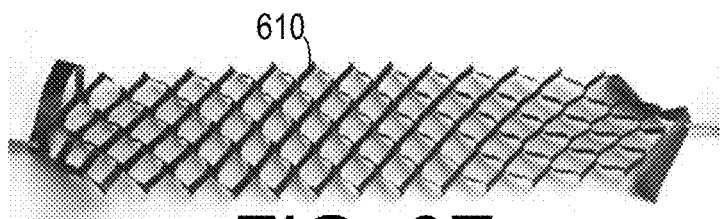

A preferred embodiment of the invention is now described in detail. Referring to the drawings, like numbers indicate like parts throughout the views. Unless otherwise specifically indicated in the disclosure that follows, the drawings are not necessarily drawn to scale. The present disclosure should in no way be limited to the exemplary implementations and techniques illustrated in the drawings and described below. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Also, as used herein "graphene oxide particles" includes sheets of graphene oxide and flakes of graphene oxide.

Kirigami is a form of paper manipulation in which a sheet of paper is cut and folded into a desired shape that often has multi-dimensional characteristics. A kirigami structure includes a piece of paper that has been cut and folded into the desired shape.

In one method of making a kirigami structure, as sheet of graphene oxide composite paper 120 (such as a paper that includes graphene oxide particles held by bio-protein fibers, such as silk fibers) is placed on a supporting substrate 110 (such a vinyl sheet), as shown in FIG. 1A. The graphene oxide composite paper 120 is placed in an environment of high relative humidity (e.g., an environment approaching 100% relative humidity), such a humidifier chamber 130, for a period sufficient to induce water plasticization of the graphene oxide composite paper 120, as shown in FIG. 1B. After sufficient plasticization has occurred, the sheet of graphene oxide composite paper 120 is cut according to a predetermined plan, typically with a computer numerical controlled drag knife 132, which results in a plurality of cuts 122, as shown in FIG. 1C. Once cut, the supporting substrate 110 is removed from the graphene oxide composite paper 120, as shown in FIG. 1D.

In one embodiment, the graphene oxide-composite paper is made by generating a slurry of fibers in a liquid, such as ultra-pure water. A predetermined amount of graphene oxide particles are added to the slurry and mixed into it. The liquid is then removed from the slurry, typically with a vacuum-assisted filtration system of a type common to the art of paper making, so as to form the graphene oxide-composite paper.

A reducing agent, such as aluminum nanoparticles applied through electron beam deposition, can be applied to part, or the entire sheet, of graphene oxide-composite paper. The reducing agent reduces the graphene oxide so as increase electrical conductivity of parts of the sheet of graphene oxide-composite paper. The reducing agent is removed from the sheet of graphene oxide-composite paper so as to expose reduced graphene oxide. The result can be that unreduced regions act as insulators whereas reduced regions act as conductors.

The sheet of graphene oxide-composite paper 120 can be manipulated into a kirigami structure to achieve a desired functionality.

In one method of cutting the sheet of graphene oxide-composite paper 120, a computer numerical controlled drag knife is programmed with a predetermined pattern of cuts. The sheet of graphene oxide-composite paper 110 is placed on a platform of the computer numerical controlled drag knife. The computer numerical controlled drag knife is then activated so as to cause it to cut the sheet of graphene oxide-composite paper according to the predetermined pattern of cuts.

As shown in FIG. 2A, the pattern of cuts on the sheet 220 can include an array of evenly dispersed horizontal cuts 222 and vertical cuts 224. As shown in FIG. 2B, the sheet 220 can be stretched in two dimensions without tearing. This configuration can be used when a flexible conductor is required in a multi-dimensional stretching environment (for example when a conductor is required in a stretchable apparel item).

As shown in FIG. 3A, the knife 132 can make a through cut 122, in which the cut passes all of the way through the sheet of paper 120. As shown in FIG. 3B, the he knife 132 can make a partial cut 324, in which the cut does not pass all of the way through. Such partial cuts 324 can be useful in making precise folds in the sheet of composite paper 120.

For example, the plan in FIG. 4A includes through cuts 322, valley fold partial cuts 324 that are cut in the bottom surface of the paper 120 and that are useful in folding parts of the paper downwardly. Mountain fold partial cuts 326, that are cut in the top surface of the paper 120 are useful in folding parts of the paper upwardly. When the cuts are made in a diamond pattern 410, this results in a three-dimensionally dispersed pattern of the type shown in FIG. 4B. A pattern of the type shown in FIG. 5A, results in a compressible structure 510, as shown in FIG. 5B.

Figure 7A:
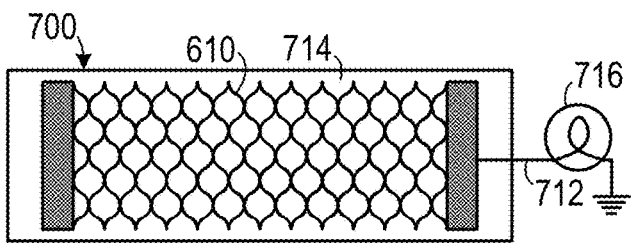
FIGS. 7A-7B is are schematic diagrams showing a paper sheet cut according to the plan of FIG. 6A as it is stretched employed in a triboelectric touch sensor.
Figure 7B:
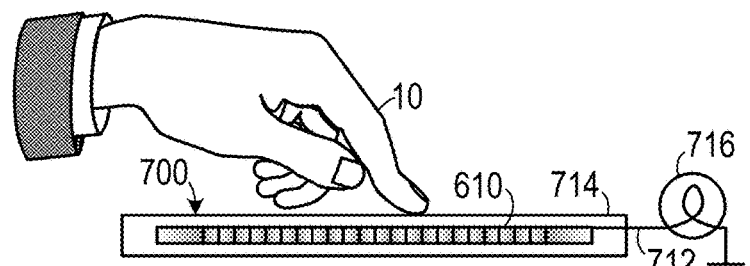

As shown in FIG. 6A, cutting pattern employing parallel cuts 622 results in a kirigami structure 610 that is stretchable along a dimension that is transverse to the cuts 622, as shown in FIGS. 6B-6E. This pattern can be useful in making a flexible triboelectric generator 700, as shown in FIGS. 7A and 7B. In making a flexible triboelectric generator 700, at least one side of the sheet is reduced, as described above and a conductor 712 is electrically coupled to the reduced graphene oxide. The flexible kirigami structure 610 is encapsulated with an envelope 714 of an elastic triboelectric substance. The triboelectric substance has a place on a triboelectric series that is different from a place on the triboelectric series of what will be used to contact it (such as a human skin on a finger 10). In one embodiment, the triboelectric substance includes polydimethylsiloxane. The conductor 712 can be electrically coupled to a load 716 so that when the envelope 714 is touched by the contacting member 10 charge equalization will occur in between the envelope 714 and the finger 10. When the finger is removed, the surface envelope 714 will experience a charge imbalance and a current passing through the load 716 will compensate for the charge imbalance by bringing charges to the conductive kirigami structure 610.

One experimental embodiment included a facile, two-step approach that transforms large-area sheets of bio-enabled graphene nanocomposite papers ("biopapers") into multi-dimensional geometries for pop-up and stretchable electronics such as wire interconnects and energy harvesters. Water-vapor annealing facilitates the controlled plasticization of the composite biopaper, allowing highly localized kirigami cuts by programmable drag-knife. Adjusting drag-knife depth, facilitates generating a micro-scale array of full-cuts and partial-cuts, enabling a purely topological approach toward the elimination of metastable fold states in kirigami structures, and the precise placement of crack fracture paths. Through orthogonal control over bio-nano-composite conductivity, this biopaper system can be used as a platform for prospective soft and shape-transforming electronics.

In the experimental embodiment, a programmable drag-knife approach was used toward the fabrication of kirigami structures of non-traditional graphene papers reinforced with silk fibroin (SF) that enables significant 3D strain responses. This approach affords control over cut pressure, position, depth and biocomposite integrity over large areas, opening a route toward the generation of complex internal biaxial stress distribution control via a combination of partial-cuts as well as through-cuts patterns. Having partial cut depth control enables the design of preferential creasing, programmable directionality for out-of-plane buckling, and pre-defined loci of weakness for controlled material failure. Exploiting partial cuts demonstrates various human-scale structures for pop-up electronics. The drag-knife kirigami approach enables the reconfiguration of graphene-silk fiber ("GO-silk") structural and mechanical properties at the macro-scale and meso-scale, while retaining superior properties such as the capacity for the graphene oxide ("GO") components to be reduced to yield a highly conductive percolating reduced graphene oxide ("rGO") network enabling reconfigurable bioelectronics by fabricating a GO biopaper energy harvester.

Evaporation of water solvent from a Meyer-bar cast graphene oxide (GO) and silk fibroin (SF) aqueous slurry leaves the GO and SF assembled into a robust, nacre-like multilayered composite across large-areas (up to 0.5 $m^2 \times 0.5$ $m^2$). The network of hydrogen bonding formed between moieties on GO and SF components assembled in a layered matter are thought to be the origin of synergistic strengthening and toughening with ultimate strength of up to 300 MPa, and toughness of 2.3 MJ m-3.

However, these bionanocomposites have limited processability due to their resulting high mechanical robustness after the constituent components form their network of intramolecular interactions during solvent removal. An additional challenge is that as bionanocomposites are developed with prioritized strength or modulus, this often makes these materials susceptible to brittle, catastrophic modes of failure at modest strains. This results in a macroscopic geometry fixed to their as-manufactured form factor as flat sheets either in the shape of the filtration funnel for vacuum-assisted filtration, or the container for cast-drying.

Kirigami structures can be made using a numerical-controlled drag knife. To generate intricate cut patterns with critical cut dimensions as small as 20 microns into bionanocomposites, a two-part drag-knife kirigami process whereby first the biopaper undergoes a water-vapor plasticization was used. This was followed by pressure-controlled cutting using a computerized numerical control (CNC) drag knife. In as-cast biographene papers the drag knife plowing leaves visible pull-out features from the separation of the layered GO-SF materials. Therefore, for strong and tough GO-SF biocomposites to be made amenable to kirigami patterning, the GO-SF sheets are treated in water vapor, a plasticizer for biomaterials. The intercalated water molecules increase free volume in the composite, creating a lubrication effect that facilitates sliding between the component molecules and disrupting the hydrogen bonding network, making otherwise strong and brittle materials susceptible to controlled localized plastic deformation. Beyond a threshold time of water-vapor treatment of 20 min, the drag knife makes good cuts without leaving visible pull-out features from the separation of GO-SF layers. After returning the biopaper to ambient conditions (about 40% relative humidity), the unperturbed GO-SF retains its dry-state properties.

The GO-silk biopaper cross section cuts can be controlled through partial cuts. In the cutting step, pressure is exerted by the edge of a computer-numerical controlled high-angle (e.g., 60°) blade, displacing the water-plasticized GO-silk biopaper to form cut features with a mechanical step-resolution of 10-μm. The controlled out-of-plane buckling of cut-patterned GO-SF biopapers enables a diverse array of geometries. The versatility of accessible design patterns opens a route toward the tuning the mechanical properties and shape transformation pattern. Among successfully implemented designs in this study are a 1D stretchable pattern of parallel slits (FIG. 6A), a 2D stretchable auxetic sheet (FIG. 5A), 3D self-supported pop-up cube and helical spring, a moving 3D pop-up spinner (FIG. 4A), and a long, flexible conductive wire interconnect. The as-cast GO-SF films are exceptionally strong, with an ultimate strength of 140 MPa with large-area sheets showing an average strain at break of 1.8% and elastic modulus of 7.3 GPa. One perpendicular partial cut (10-μm blade extension) in a GO-SF biopaper coupon with 2-mm×40 μm cross section and 20-mm gauge length, can result in an average ultimate strength of 31 MPa, strain at break of 0.91%, elastic modulus of 3.9 GPa and toughness of 0.11 MPa.

The capacity to make partial cuts with a controlled depth through substrate material and controlled stress-strain properties has resulted in useful structures. These cuts have been employed in two experimental demonstrations: the facilitation of directional buckling, and for introducing points for controlled material failure. A typical cut pattern for producing uniaxial stretching is a series of parallel slits that are aligned perpendicular to the direction of stretching. As the material is stretched, macroscopic deformations are allowed through the buckling of slit flaps out-of-plane. For a flat film patterned with through cuts in this parallel slit arrangement, the direction the slit flap initiates buckling to accommodate macroscopic strain is random, arriving at its lowest energy state through geometric frustration in processes whose resultant structures are difficult to predict. Incorporation of the partial cuts suggested here introduces a preferential direction for buckling. By torque equilibrium, a partial cut could induce buckling in the opposing direction. A partial cut from the top surface could result in preferential "mountain" (M) folding, while a partial cut from the bottom surface would result in preferential "valley" (V) folding.

Using two cut motifs introduced above, mountain and valley folds were designed through the strategic placement of partial cuts on the top and bottom side of the GO-SF biopaper. Positioning M-partial cuts always to one side of V-partial cuts (MV-MV—etc.) allows controllably generation of a stable arrangement where all the slit-flaps are buckling in the same direction. By switching the order in the middle of the kirigami structure (MV-MV¬VM-VM), defined unstable arrangement can be created where the slit-flaps are buckling in opposing directions. Parallel slit sheets with the corresponding partial cuts to produce the stable and unstable slit flap arrangements.

The positioning of partial cuts can also define loci of mechanical failure. Also, controllable placing through partial cuts predetermine the crack position and propagation.

Drag-knife cut biopapers can be converted into highly conductive substrates. By using a technique of anodic metal-assisted reduction, the GO-SF biopaper is converted from insulating GO to highly-conductive reduced graphene oxide (rGO)—increasing the conductivity by six orders of magnitude up to 1.2*104 S/m at ambient conditions (29, 30). Regions of the GO-SF that have undergone reduction could be seen by visual inspection, changing from black in color and dull in luster, to grey and shiny. The changes in the visual appearance, spectroscopic properties, and electronic properties confirm the chemical conversion of the GO-SF biopaper. By XPS, metal-assisted reduction significantly increases the C-to-O atomic ratio in the biopaper from 2.4 to 3.6, and produces a commensurate shift in carbon chemical state away from lower oxygen-containing moieties (such as C—OH and $CO_2H$ centered at 286 eV) to non-oxygenated moieties (such as C—C and C=C, centered at 284.5 eV), matching observations in GO reduction by hydrazine or ascorbic acid. Raman spectroscopy also shows characteristic increase in D-band (centered at 1350 cm-1) to G-band (centered at 1600 cm-1) areal ratio from 0.90 to 1.19, and sharpening of the D-band peak, associated with the reduction of GO. Changing the extent of reduction (through longer reduction time, or more reduction cycles), does not show impact to cut-patterns and mechanical performance. The GO-SF biopapers cut with a 1D stretch pattern (as shown in FIG. 6A), show remarkable invariance of conductance in response to mechanical agitation such as stretching up to 150% and twisting by up to 360°. These observations demonstrate the robustness of drag-knife patterned GO-SF biopapers as a platform for circuitry for non-rigid use cases.

Kirigami biopaper structures can be assembled into highly stretchable energy harvesters. The cut-patterned rGO-SF biopaper was assembled as a stretchable, touch-activated energy harvester (as shown in FIGS. 7A and 7B). Conventional single-electrode energy harvesters are constructed from a metal (Cu, Al) surface supported on a surface. Due to the difference in electron affinity between the rGO-SF energy harvester and a contacting surface, such as the skin surface of human fingertips, will produce a charge transfer upon contact and release due to through simultaneous processes of contact electrification and electrostatic induction.

For the rGO-SF device fabricated in the experimental embodiment, a keystroke touch by a human index finger produces an open-circuit voltage (VOC) and short-circuit current (ISC) of approximately 40 V and 15 nA respectively. This device operates as a single-electrode triboelectric nanogenerator, where the rGO-SF biopaper acts as the electrode and the PDMS encapsulation layer as one triboelectric material. Human skin or other contact surface works as the other triboelectric material. When a tapping finger touches the device, positive and negative triboelectric charges will be induced on the surfaces of the skin and PDMS, respectively, due to contact electrification. When the finger leaves the device, the negative charges on PDMS will generate a negative potential on the rGO-SF biopaper due to electrostatic induction and drive electrons to flow from the rGO-SF biopaper to the ground electrode, inducing an electrical current flowing in the other direction. As the skin reapproaches the device, electrons will flow back to the biopaper and induce a current in the opposite direction. When the skin stays on or at a constant distance to the device, the open-circuit output voltage will remain relatively stable, corresponding to the close-to-zero values and the high plateau respectively, and the short-circuit current will stay as zero. As the gap distance between the skin and device changes, the change in voltage and current pulses are observed. Compared to conventional mechanical energy harvesting devices based on electromagnetic or piezoelectric generator, this single-electrode device has the advantage of being highly stretchable. Its flexibility also enables facile application on wide range of objects and generation of electricity with almost any moving object.

The experimental embodiments demonstrated large-scale drag-knife kirigami graphene biopapers that are highly stretchable, mechanically robust, conductive, and capable of dramatic shape transformation under strain. An important aspect of enabling the smooth cutting of the strong, tough biopaper is a water-vapor pretreatment that can induce the controlled plasticization resulting in a transient soft, drag-knife processible material. This technique can extend across the gamut of hydrogen-bonded biomaterials, and especially useful for transforming superior nano-structured and microstructured bionanocomposites into functional meso- and human-scale 2D and 3D form factors. An important advantage of drag-knife kirigami approach demonstrated here is the capacity to reliably generate full and partial-cut patterns that were leveraged into generation include: 1) loci for controlled material failure, 2) loci for preferential creasing, and 3) control over folding direction. The generation of conductive microtraces in GO-SF biopapers through controlled reduction can be done in tandem and affords orthogonal control over generated electronic properties. Drag-knife kirigami increases strain tolerance in the bionanocomposite system that has otherwise low strain-at-break, while patterned reduction generates a conductive network of microtraces. Combining the two processing techniques produces the stretchable triboelectric nanogenerator in a robust bionanocomposite paper. This GO-SF nanogenerator is mechanically reconfigurable, and can be extended into the wide array of 1D stretchable, 2D auxetic, and 3D pop-up geometries.

The following discusses some fabrication issues relating to the experimental embodiments:

Fabrication of GO-SF bionanocomposite papers. The SF binder for the biopapers was extracted from the cocoon of the *Bombyx mori* silkworm in accordance with established sericulture protocols. The suspended SF was dialyzed against water to yield a stock solution concentration of 50 mg/ml. Graphene oxide (GO) flakes were exfoliated from natural graphite powder (325 mesh, Alfa Aesar, USA) using Hummer's method and diluted by ultrapure water (18.2 MΩ-cm) to 5 mg/ml. The GO dispersion was mixed with the silk fibroin suspension by stirring to yield a GO-to-SF weight ratio of 50:1. The GO-SF dispersion was cast-dried in a dish lined with fluorinated ethylene polymer (Teflon FEP, DuPont), with a typical sheet cast across a 0.5-m by 0.5-m area, with a dry-thickness of 30 microns.

Generation of patterned cuts in GO-SF biopapers. The GO-SF biopaper was mounted onto a vinyl substrate (OraCal 651) as a release liner. The mounted GO-SF biopaper was placed in an enclosed chamber with a humidifier (~100% relative humidity for about 1 hour) to enable the GO-SF for cutting by water plasticization. The water-plasticized GO-SF biopaper on substrate was cut using a drag knife (carbide blade 60° from Tormach) under computerized numerical control (Silhouette CAMEO 3) with cuts made by media-moving with a mechanical step resolution of 10-μm, a typical kerf width of 20-μm, and at speed up to 0.1 m/s. Each pass of cut patterns was designed using a graphics editor (Inkscape), and cut depth controlled by blade offset (1.25× thickness for full cuts, 0.75× thickness for partial cuts). Mountain cuts were made by partial cut from the top side of biopaper. Valley cuts were made by partial cuts from the bottom side of the biopaper—made by turning over the biopaper, aligning against cut fiducial marks, before making second set of partial cuts. Mechanical characterization was performed using a Shimadzu EZ-SX tester. Cut interfaces were characterized using atomic force microscopy (Bruker, Dimension ICON), and scanning electron microscopy (Hitachi SU8230).

Generation of conductive micro-traces in GO-SF biopapers. Highly conductive reduced GO-SF film was generated from the metal-assisted reduction of GO-SF. For large-area conductive regions, 500-nm thick Al was deposited onto the cut GO-SF biopapers via electron beam evaporation (CHA Mark 50, CHA Industries). For patterned conductive traces with features with a critical dimension as small as 70-um, an Al metallization paste (EFX-37, monocrystal aluminum) was applied through a stencil screen (500TV front-contacting, Haver&Boecker). The Al-patterned GO-SF was dampened with ultrapure water (18.2 MΩ-cm), and clamped between PFTE blocks overnight. Using a stream of water to rinse away the Al yields highly conductive rGO-SF biopaper, with highly conductive features. Verification of extent of reduction utilized X-ray photoelectron spectroscopy (Thermo Scientific K-alpha), and Raman spectroscopy (Alpha-WITec 300R, 532 nm laser).

Fabrication of single-electrode triboelectric nanogenerator. A soft PDMS was prepared from a weight ratio of 20:1 Sylgard 184 base to curing agent. A 3-mm thick PDMS base layer was cast into a 3-in Petri dish. Trapped air bubbles were removed by vacuum desiccation, and the PDMS mix was soft-cured (80° C. oven for 0.5 hours). A 24-gauge (0.51 mm) Cu wire was held in contact with the reduced surface of the cut-patterned GO-SF biopaper, and placed on top of the PDMS base layer. A 3-mm thick PDMS top layer was cast over the rGO-SF biopaper and Cu wire. Trapped air bubbles were removed by vacuum desiccation, and the GO-SF device encapsulated in PDMS was cured (80° C. oven for 1.5 hours). The PDMS was cut around the rGO-SF device. The end of the Cu wire was stripped of the PDMS to serve as the current collector.

Defining kerf width of drag-knife cuts. The minimum width of displaced material by cut, or the kerf width, is defined by the blade width—where blade width scales with thickness and blade angle according to 2*thickness*tan($\pi$/2-blade angle). However, this relation does not apply at small cut widths due to tapering at the blade tip, and interactions between the blade and cut material. Increasing the time of water-vapor treatment up to the threshold treatment time decreases the kerf width. In samples without water-vapor treatment, tears and pull-out features in the GO-SF can increase the kerf width multi-fold. Using the tabletop cutter in this experiment fitted with commercially-available 60° blades cutting at 200 mm/s, we can generate ~20-$\mu$m kerf widths in thin 10-$\mu$m thick GO-SF sheets. For instance, setting the blade extension to at or exceeding the GO-SF biopaper thickness produces full cuts, whereas setting the blade extension to less than 0.5× the GO-SF biopaper thickness creates partial cuts.

Chemical verification of conversion of GO biopaper to rGO by reductant paste. The conversion of the GO component in the biopaper to rGO was verified through Raman and X-ray photoelectron spectra. Raman spectroscopy revealed an increase in ID/IG ratio from 0.9 to 1.2 (D-band at 1350 cm-1, G-band at 1600 cm-1), and a narrowing of the ID band characteristic of the introduction of sp2 structure defects introduced by GO reduction methods. XPS revealed a decrease in carbon fraction with a oxidized chemical state, increasing the carbon-to-oxygen atomic ratio from 2.4 to 3.6. High resolution XPS scans show no detectable Al 2p peak, indicating the anodic metal employed in the reduction was removed. One key to GO-SF biopapers as a platform for reconfigurable electronics is the orthogonal control over mechanical properties in the biopaper assembly and processing, and electronic properties through reduction. Changes in GO-SF biopaper mechanical properties derived through changing composition (i.e. SF wt. fraction from 0-5%), annealing (i.e. methanol-vapor annealing of SF, or thermal annealing), and post-processing (patterned cuts by CNC drag knife), do not arrest the reduction process for GO.

Although specific advantages have been enumerated above, various embodiments may include some, none, or all of the enumerated advantages. Other technical advantages may become readily apparent to one of ordinary skill in the art after review of the following figures and description. It is understood that, although exemplary embodiments are illustrated in the figures and described below, the principles of the present disclosure may be implemented using any number of techniques, whether currently known or not.

Modifications, additions, or omissions may be made to the systems, apparatuses, and methods described herein without departing from the scope of the invention. The components of the systems and apparatuses may be integrated or separated. The operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set. It is intended that the claims and claim elements recited below do not invoke 35 U.S.C. § 112(f) unless the words "means for" or "step for" are explicitly used in the particular claim. The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method for making a flexible material, comprising the steps of:
   (a) subjecting a sheet of graphene oxide-composite paper that includes silk fibers and a graphene oxide material to an environment having a relative humidity above a predetermined threshold for a predetermined amount of time sufficient to induce water plasticization of the graphene oxide-composite paper to form water plasticized graphene oxide-composite paper; and
   (b) after plasticization has occurred and while the graphene oxide-composite paper is water plasticized, then cutting at least one expansion cut in the sheet of water plasticized graphene oxide-composite paper.

2. The method of claim 1, wherein the graphene oxide material includes a selected one of:
   graphene oxide particles, graphene oxide sheets, and graphene oxide flakes.

3. The method of claim 1, further comprising the step of generating the graphene oxide-composite paper by performing the steps of:
   (a) generating a slurry of fibers in a liquid;
   (b) adding a predetermined amount of graphene oxide particles to the slurry;
   (c) removing the liquid from the slurry so as to form the graphene oxide-composite paper.

4. The method of claim 3, wherein the fibers comprise a fibrous bio-protein.

5. The method of claim 4, fibrous bio-protein comprises silk.

6. The method of claim 1, further comprising the steps of:
   (a) applying a reducing agent to a region of the sheet of graphene oxide-composite paper so as to increase electrical conductivity of the region of the sheet of graphene oxide-composite paper; and
   (b) removing the reducing agent from the region of the sheet of graphene oxide-composite paper so as to expose a region of reduced graphene oxide.

7. The method of claim 6, wherein the reducing agent comprises aluminum nanoparticles.

8. The method of claim 6, wherein the step of applying a reducing agent includes the step of subjecting sheet of graphene oxide-composite paper to electron beam evaporation of the reducing agent.

9. The method of claim 1, further comprising the step of manipulating a portion of the sheet of graphene oxide-composite paper into a kirigami structure.

10. The method of claim 1, wherein the cutting step comprises the steps of:
(a) programming a computer numerical controlled drag knife with a predetermined pattern of cuts;
(b) placing the sheet of graphene oxide-composite paper on a platform of the computer numerical controlled drag knife; and
(c) activating the computer numerical controlled drag knife so as to cause it to cut the sheet of graphene oxide-composite paper according to the predetermined pattern of cuts.

11. The method of claim 1, further comprising the steps of:
(a) attaching a conductor to the region of reduced graphene oxide;
(b) encapsulating the flexible material with an envelope of an elastic triboelectric substance so that the conductor extends outside of the envelope, the triboelectric substance having a place on a triboelectric series that is different from a place on the triboelectric series of a contacting member.

12. The method of claim 11, wherein the triboelectric substance comprises polydimethylsiloxane.

13. The method of claim 11, wherein the place on the triboelectric series of the contacting member corresponds to a place on the triboelectric series for human skin.

14. A method for making a flexible conductive material, comprising the steps of:
(a) subjecting a sheet of a composite paper including graphene oxide particles and silk fibers to an environment having a relative humidity above a predetermined threshold for a predetermined amount of time sufficient to induce water plasticization of the graphene oxide-composite paper to form water plasticized graphene oxide-composite paper; and
(b) applying aluminum to a region of the sheet of composite paper so as to increase electrical conductivity of the region of the sheet of composite paper;
(c) removing the aluminum from the region of the sheet of composite paper so as to expose a region of reduced graphene oxide;
(d) cutting at least one expansion cut in the sheet of plasticized composite paper while the sheet of plasticized composite paper is water plasticized; and
(e) manipulating the sheet of composite paper into a kirigami structure.

15. A method for making a flexible material, comprising the steps of:
(a) subjecting a sheet of graphene oxide-composite paper that includes silk fibers and a graphene oxide material to an environment having a relative humidity above a predetermined threshold for a predetermined amount of time sufficient to induce water plasticization of the graphene oxide-composite paper to form water plasticized graphene oxide-composite paper; and
(b) after plasticization has occurred and while the graphene oxide-composite paper is water plasticized, then cutting at least one expansion cut in the sheet of water plasticized graphene oxide-composite paper; and
(c) generating the graphene oxide-composite paper by performing the steps of:
generating a slurry of silk fibers in a liquid;
(ii) adding a predetermined amount of graphene oxide particles to the slurry;
(iii) removing the liquid from the slurry so as to form the graphene oxide- composite paper.

16. The method of claim 15, further comprising the steps of:
(a) applying aluminum nanoparticles as a reducing agent to a region of the sheet of graphene oxide-composite paper so as to increase electrical conductivity of the region of the sheet of graphene oxide-composite paper;
(b) subjecting sheet of graphene oxide-composite paper to electron beam evaporation of the reducing agent; and
(c) removing the reducing agent from the region of the sheet of graphene oxide-composite paper so as to expose a region of reduced graphene oxide.

17. The method of claim 15, further comprising the step of manipulating a portion of the sheet of graphene oxide-composite paper into a kirigami structure.

18. The method of claim 15, wherein the cutting step comprises the steps of:
(a) programming a computer numerical controlled drag knife with a predetermined pattern of cuts;
(b) placing the sheet of graphene oxide-composite paper on a platform of the computer numerical controlled drag knife; and
(c) activating the computer numerical controlled drag knife so as to cause it to cut the sheet of graphene oxide-composite paper according to the predetermined pattern of cuts.

19. The method of claim 15, further comprising the steps of:
(a) attaching a conductor to the region of reduced graphene oxide;
(b) encapsulating the flexible material with an envelope of an elastic triboelectric substance so that the conductor extends outside of the envelope, the triboelectric substance having a place on a triboelectric series that is different from a place on the triboelectric series of a contacting member.

20. The method of claim 19, wherein the triboelectric substance comprises polydimethylsiloxane and wherein the place on the triboelectric series of the contacting member corresponds to a place on the triboelectric series for human skin.

* * * * *